United States Patent [19]

Landre

[11] Patent Number: 4,620,151

[45] Date of Patent: Oct. 28, 1986

[54] ELECTRIC CURRENT MEASURING TONGS WITH MAGNETIC CIRCUIT AND PIVOTING ARM

[75] Inventor: Bernard Landre, Paris, France

[73] Assignee: Universal Technic, Paris, France

[21] Appl. No.: 563,636

[22] Filed: Dec. 20, 1983

[30] Foreign Application Priority Data

Dec. 22, 1982 [FR] France .............................. 82 21586

[51] Int. Cl.[4] ........................ G01R 1/20; H01F 17/06
[52] U.S. Cl. .................................... 324/127; 336/176
[58] Field of Search ....................... 324/127, 129, 149; 336/176

[56] References Cited

FOREIGN PATENT DOCUMENTS

| | | | |
|---|---|---|---|
| 211427 | 10/1960 | Austria | 324/127 |
| 576994 | 5/1933 | Fed. Rep. of Germany | |
| 822570 | 11/1951 | Fed. Rep. of Germany | 324/127 |
| 2044648 | 2/1971 | France | |
| 2170303 | 9/1973 | France | |
| 2315696 | 1/1977 | France | |

Primary Examiner—Ernest F. Karlsen
Attorney, Agent, or Firm—Cushman, Darby & Cushman

[57] ABSTRACT

The present invention relates to an electric current measuring tongs with magnetic circuit which opens by a combination of linear and rotary movements, wherein the magnetic circuit accommodated in a housing (12) consists of two elements (1, 2), of which one (2) is mounted pivotably on the housing whereas the other (1) is adapted to be moved in a linear movement relative to the first element so as to permit the pivoting of the element (2) to open the circuit. The facing plane faces (3, 4; 5, 6) of the constituent elements (1, 2) of the magnetic circuit consists of plane oblique sections intended to come into close contact during the closure of the magnetic circuit.

9 Claims, 3 Drawing Figures

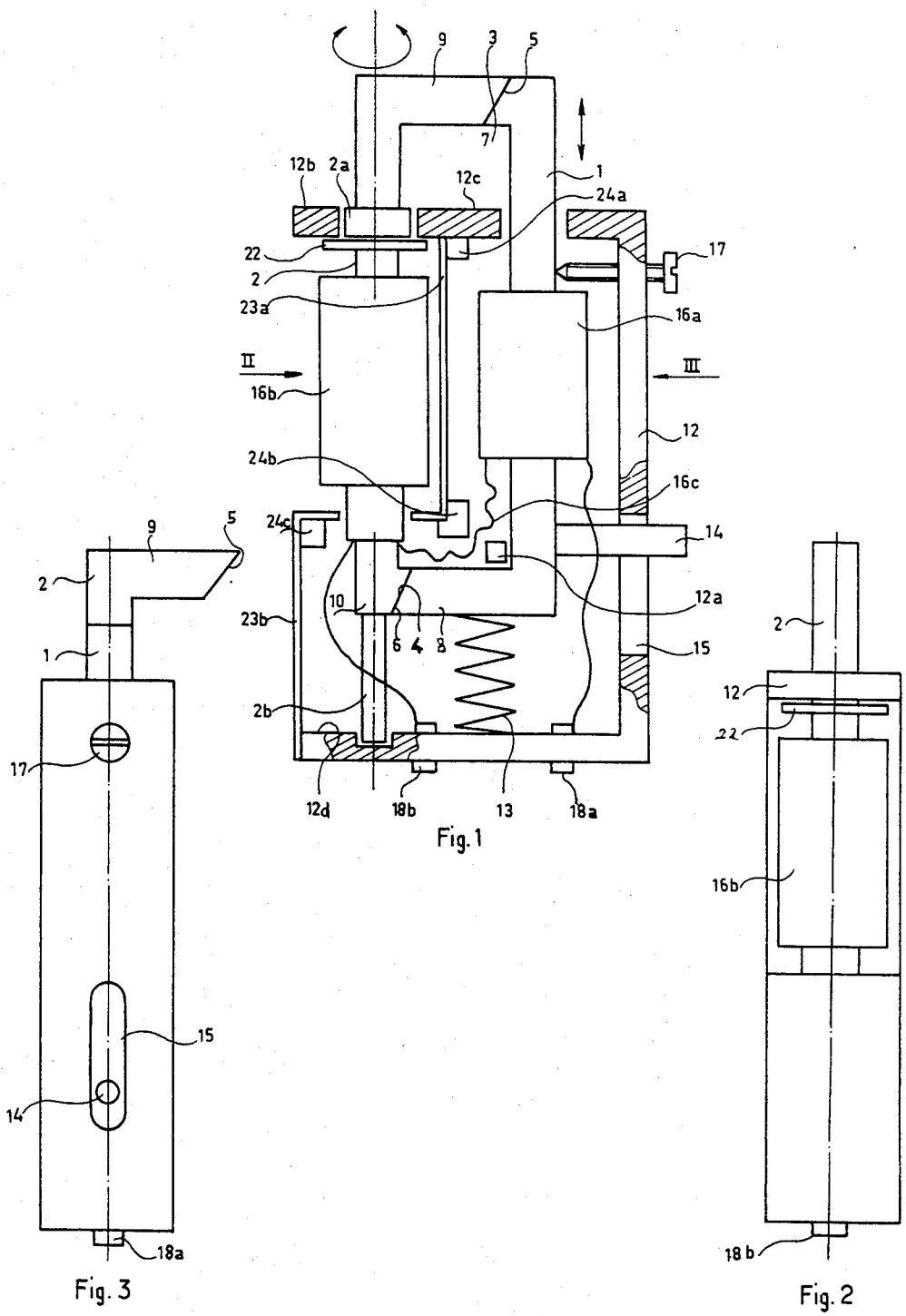

ELECTRIC CURRENT MEASURING TONGS WITH MAGNETIC CIRCUIT AND PIVOTING ARM

FIELD OF THE INVENTION

The present invention is in the field of electric current measuring tongs with magnetic circuit, likewise known as "ammeter tongs", which permit the analysis or measurement of the characteristics of electric currents flowing in conductors of the cable or bar type.

PRIOR ART

Different types of measuring tongs of this class are known. For example in French Pat. No. 2,315,696, the applicant company described a type of tongs which, contrary to those of the prior art in which the elements of magnetic circuits are limited in their own movement to the oscillation necessary to ensure good bearing of the magnetic joints, exhibits an arrangement wherein one or both the elements of the magnetic circuit can, during the operation of clamping the electric conductor, assume an infinity of positions included between two extreme positions for a portion of the circuit. This arrangement with multiple pivoting combinations gives this appliance great facility for clamping electric conductors which are difficult of access or much surrounded by other conductors, partitions et cetera. However, tongs of this type do not always give satisfaction because when the articulated tongs is positioned round the cable the outside dimension of the whole increases, and on the other hand, when the tongs is skewed, a reaction of the conductor surrounded by the tongs counter to the action of the spring, and therefore to the direction of closure of the tongs, occurs, which does not permit excellent locking (or blocking) of the magnetic circuit to be achieved.

Tongs are also known whose magnetic circuit consists of a generally U-shaped fixed part and of a movable part, likewise generally U-shaped in the opposite direction, the end faces of which come into close contact by the action of elastic means, the circuit being capable of manual opening by means of a pull rod fixed to the movable part so as to permit the lateral penetration of a cable within the magnetic circuit. Although this novel tongs device presents some improvement compared to the prior art devices, by coming close to the ideal model of a "horseshoe-airgap" magnetic circuit, nevertheless it still presents certain disadvantages, particularly as regards the precision of guiding of the movable part linearly and of the truing up of the end surfaces, which do not generally ensure a sufficiently close contact of the surfaces to prevent any loss of magnetic flux.

The applicant company has likewise developed an electric current measuring tongs with magnetic circuit which opens by linear movement, possessing a magnetic circuit mounted on an insulating housing consisting of two elements, one of which is fixed whereas the other is capable of being moved in a linear movement relative to the fixed element so as to open the circuit laterally, this measuring tongs possessing constituent elements of the magnetic circuit comprising plane oblique sections, the respective slope angle of which is determined so that said plane faces come into close contact when the magnetic circuit is closed.

Although this last tongs represents real progress compared to the commercially available tongs, it remains relatively difficult to use when some cables, the electrical characteristics of which it is required to determine, are grouped in excessively dense bundles, which makes it extremely difficult to engage and disengage them in the lateral aperature of the tongs, and may result in damage to the protective sheaths of said cables.

BACKGROUND OF THE INVENTION

One object of the present invention is to produce an electric current measuring tongs with magnetic circuit which opens by a combination of rotary and linear movements, and which avoids all the above-mentioned disadvantages of the prior art ammeter tongs.

A second object of the present invention is to provide a measuring tongs of likewise novel construction as regards the faces of the magnetic circuit intended to come into close contact in the closed circuit position.

Yet another object of the present invention is to provide an electric current measuring tongs with ammeter circuit which opens by a combination of a linear movement of one of the arms and a rotary movement of the other, which can easily be introduced at the level of the cables and can open frontally so as to permit cables arranged in dense bundles and/or places difficult of access to be introduced into it easily.

BRIEF SUMMARY OF THE INVENTION

The electric current measuring tongs with magnetic circuit which opens by a combination of linear movement and rotary movement according to the invention possesses a magnetic circuit accommodated in a housing and formed by two elements, one of which is capable of being moved in a linear movement relative to the other element, this second element being mounted rotatably in the housing so as to be able to pivot about its longitudinal axis, so as to open the circuit frontally, this measuring tongs further possessing constituent elements of the magnetic circuit comprising plane oblique sections, the respective slope angle of which is determined so that the said plane faces come into close contact upon closure of the magnetic circuit.

In a preferred embodiment of the invention, the two constituent elements of the magnetic circuit consist respectively of two substantially mutually parallel bars respectively possessing at their ends bent regions terminating in oblique plane faces for connection of the magnetic circuit; the element movable in rotation is mounted pivotably in the housing by means of, on the one hand, a collar fixed to said element and forming a bearing with a bore provided in the top face of the housing, and on the other hand, a shaft extending in prolongation of the longitudinal axis of the rotatable element and mounted overhung by its free end in the bottom face of the housing; the element movable in translation moves linearly while remaining substantially parallel to the rotatable element, with sufficient clearance to permit the rotation of the latter; the element movable in translation moves with a certain lateral play limited by at least one guide stop within the housing; the element movable in translation is urged into the closed position of the magnetic circuit by elastic return means; operating means being provided to exert a force opposite to that of the elastic means with a sufficient clearance to permit the opening of the circuit and the pivoting of the element movable in translation; adjusting means are provided to come into cooperation with the element movable in translation within the housing, to adjust the linear movement of the element movable in translation; both the constituent elements of the magnetic circuit are shaped to receive a winding; the elastic means for returning the movable element into the closed position of the magnetic circuit consist of a compression spring bearing on the one hand against the bottom region of the element movable in translation and on the other hand against the bottom face of the housing; the means of operating the element movable in translation consist of a pull rod moving in a port provided in a lateral face of the housing; the section of the top part of the magnetic circuit is provided precisely level with the top bend of the element movable in translation, whereas the section of the bottom part of the magnetic circuit is provided precisely level with the bottom bend of the element movable in rotation.

BRIEF DESCRIPTION OF THE DRAWINGS

Further characteristics and advantages of the rotary arm ammeter tongs according to the invention will be apparent from reading the description which follows of an embodiment which does not imply a limitation, with reference to the accompanying drawings, wherein:

FIG. 1 is a view in side elevation of the rotary arm ammeter tongs according to the invention taken from the large side of the housing, the latter being viewed partly in section, the side wall of the housing being withdrawn and the magnetic circuit in the closed position;

FIG. 2 is a view of the tongs of FIG. 1 taken in the direction of arrow II of FIG. 1; and FIG. 3 is a view of the ammeter tongs taken in the direction of arrow III of FIG. 1, the magnetic circuit being in the open position.

DETAILED DESCRIPTION OF PREFERRED EMBODIMENTS

The ammeter tongs according to the invention comprises a magnetic circuit consisiting of an element movable in translation 1 mounted slidably within the housing 12 of the ammeter tongs and guided by means of a guide cross-member 12a, and of an element movable in rotation 2 mounted pivotably on the housing 12. The elements 1 and 2 have substantially the same length, having either a parallelepipedic cross-section (as shown) or a cross-section of revolution, and are arranged substantially mutually parallel. In the respective end regions of the elements 1 and 2, bent regions 7, 8, 9, 10 are respectively made, respectively exhibiting at their free ends plane faces 3, 4; 5, 6 oriented obliquely relative to the cross-section of the respective bent regions at appropriate slope angles so that upon the closure of the magnetic circuit, as shown in FIG. 1, the oblique faces of the bent regions come into close contact. The element movable in rotation 2 is mounted on the housing by means of, on the one hand, a collar 2a which is fixed to it and forms a bearing with a bore provided in the top face 12b of the housing 12, and on the other hand a shaft 2b extending in prolongation of the longitudinal axis of the element 2. This shaft 2b is mounted overhung by its free end in a blind bore made in the internal bottom face 12d of the housing 12. Any longitudinal movement of the element 2 is prevented by virtue of a stop collar 22.

The closure of the magnetic circuit 1, 2 is effected by elastic means, for example a compression spring 13 which urges the element movable in translation 1 into the closed positon, bearing on the one hand against the bent region 8 and on the other hand against the bottom face 12d of the housing 12. The opening of the magnetic circuit is effected, on the one hand, by means of a pull-rod 14 fixed to the element movable in translation 1, and capable of moving counter to the action of the spring 13 in a port 15 made longitudinally in a wall 11 of the housing 12 in whcih the element 1 slides, and on the other hand, by a rotation, possible by the withdrawal of the element 1, of the element 2 through approximately 90°. During the unlocking movement of the magnetic circuit, the movement of the element movable in translation 1 is limited by the botttom lip of the part 15 against which the pull rod 14 abuts, whereas the pivoting of the element 2 is limited by stops, not shown in the drawing, so that the element 2 can have a movement of ±90° relative to its position of closure of the magnetic circuit.

The elements, movable in translation 1 and movable in rotation 2, of the ammeter circuit each carry a winding, the respective windings 16a, 16b being connected in series, the conductor 16c which connects them being provided sufficiently long to permit the element 1 to execute its sliding movement at opening without hindrance or breaking of the circuit. Each winding 16a, 16b is likewise connected to respective termnals 18a, 18b provided on the bottom face of the housing 12. The winding 16b is protected by a hood and serves as a tapping to impart a rotation to the movable element 2 in the opening or the closure of the ammeter circuit. For this purpose, a system of partitioning 23a, 23b and of cross-members 24a, 24b, 24c has been provided to insulate the coil 16b from the housing 12.

The oblique bearing surfaces 3, 4; 5, 6 exhibit relatively slight slope angles relative to the cross-section of the corresponding bent regions 7, 8; 9, 10, so as to obtain a breakdown of the return forces of the elastic means 13 which is highly favorable to the efficacity of closure of the magnetic circuit.

Adjusting means 17 have likewise been provided, which cooperate laterally with the element movable in translation 1, and the guide stop 12a within the housing, so as to permit an adjustment or a compensation of the machining tolerances of the constituent elements 1, 2 of the magnetic circuit, and also of any imperfections which may result from the use of the ammeter tongs after some time in service. These adjusting means advantageously consist of a point screw 17 screwed into a tapped through hole in a wall 11 and coming into contact with a lateral wall of the movable element 1 so as to orient the movable element 1 according to a preferential linear path permitting close contacting of the juntion faces 3, 5 and 4, 6 of the magnetic circuit.

The ammeter tongs according to the present invention may be used in the following manner: first, the magnetic circuit is opened by applying to the operating means 14 a force which urges the element movable in translation 1 in the direction of opening the magnetic circuit, counter to the elastic return means 13, thus releasing the element movable in rotation 2 which is rotated through approximately 90° so as to define a frontal opening in the magnetic circuit for the passage of the conductor carrying a current, the electrical characteristics of which it is required to determine, whereafter, by inverse rotation, the movable element 2 is restored to its original position and the force applied to the operating means 14 is relaxed and the magnetic circuit closes again by the action of the elastic return means 13 which urge the element movable in translation 1 into the blocking position of said magnetic circuit against the element movable in rotation 2 returned to its original position. The required determinations may then be undertaken.

Clearly, the external dimension of the elements of the arms 1, 2 of the magnetic circuit, having been reduced to a minimum, permits the conductors to be measured to be brought closer, just as the sliding of the element 1 permits the pivoting of the rotatable element 2, thus clearing a frontal window through which the conductor can easily be introduced into the magnetic circuit, which will be closed by inverse rotation of the element 2 followed by self-locking translation of the element 1 by the action of the elastic return means 13.

It will readily be understood that the point screw 17 serves on the one hand as a reaction point to apply the faces 3 and 4 of the circuit element movable in translation 1 against the corresponding faces 5 and 6 of the circuit element movable in rotation 2 by the action of the breakdown of force of the spring 13, and on the other hand, by means of the regulation of the respective height of the circuit element movable in translation 1 relative to the circuit element movable in rotation 2, the element movable in translation having a tendency to rise higher when the screw 17 is slackened.

This arrangement makes it possible, not only to exert a good bearing force of the oblique faces against each other, but also to make the bearing faces coincide exactly one with the other and thus to prevent losses of magnetic flux at the level of the external faces of the elements of the magnetic circuit. For reasons of facility in use during opening, it will be understood that it is preferable for the section of the magnetic circuit in its external arm (faces 3 and 5) to be as close as possible to the top bent part of the circuit element movable in translation, and preferably precisely level with the bend 7 of the movable element 1, likewise, for reasons of bulk at the time of the pivoting of the rotatable element 2, the section of the bottom part (faces 4, 6) must be as close as possible to the bent bottom part of the circuit element movable in rotation, and preferably precisely level with the bend 10 of the element 2.

The invention is in no way limited to the above-described embodiment, but embraces all modifications accessible to the expert arising from the same basic principle.

What is claimed is:

1. Tongs for measuring the electric current flowing in an electric conductor by a magnetic circuit surrounding the conductor and having an electric circuit associated with said magnetic circuit comprising:
   a housing; and
   means defining a magnetic circuit including two elements mounted for movement relative to each other, said elements having portions within said housing with an electric winding associated with at least one of said portions and said in-housing portions being provided with confronting complementary oblique faces and said elements having portions projecting out of said housing and provided with confronting complementary oblique faces, said projecting portions being adapted to enclose an electric conductor, said confronting faces being engageable to close said magnetic circuit,
   one of said elements being mounted for translational movement and the other of said elements being mounted for rotational movement to disengage said faces and move said faces of said projecting portions apart for reception therebetween of an electric conductor.

2. Measuring tongs as claimed in claim 1, wherein the elements consist of two substantially parallel bars respectively possessing at their ends bent regions each terminating in the corresponding oblique face.

3. Measuring tongs as claimed in claim 1, wherein the element movable in rotation is mounted pivotably within the housing by means of, on the one hand, a collar which is fixed to said element and forms a bearing with a bore provided in a wall of the housing, and on the other hand, a shaft extending in prolongation of the longitudinal axis of the rotatable element and mounted overhung by its free end in a blind bore made in the interior face of the opposite wall housing.

4. Measuring tongs as claimed in claim 2, wherein the element movable in translation moves linearly while remaining substantially parallel to the other element.

5. Measuring tongs as claimed in claim 1, wherein movement of the element movable in translation moves with a certain play limited by guide stops within the housing.

6. Measuring tongs as claimed in claim 1, wherein the element movable in translation is urged into the closed position of the magnetic circuit by elastic return means and including operating means to exert a force opposite to that of the elastic means to permit the disengagement of the faces.

7. Measuring tongs as claimed in claim 1 including, adjusting means mounted to the housing to come into cooperation with the element movable in translation to adjust the extent of linear movment thereof.

8. Measuring tongs as claimed in claim 1 wherein the in-housing portion of both the elements have a winding associated therewith.

9. Measuring tongs as claimed in claim 6, wherein the elastic means consists of a compression spring bearing on the one hand against the movable element and on the other hand against a wall of the housing.

* * * * *